(12) United States Patent
Lee

(10) Patent No.: US 7,960,268 B2
(45) Date of Patent: Jun. 14, 2011

(54) METHOD FOR FORMING GATE HAVING METAL LAYER IN SEMICONDUCTOR DEVICE

(75) Inventor: Jin Yul Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 899 days.

(21) Appl. No.: 11/498,579

(22) Filed: Aug. 3, 2006

(65) Prior Publication Data

US 2007/0126065 A1 Jun. 7, 2007

(30) Foreign Application Priority Data

Dec. 1, 2005 (KR) .................. 10-2005-0116421

(51) Int. Cl.
*H01L 21/3205* (2006.01)
*H01L 21/4763* (2006.01)

(52) U.S. Cl. ........................ 438/592; 438/595

(58) Field of Classification Search .................. 438/592, 438/595

See application file for complete search history.

(56) References Cited

U.S. PATENT DOCUMENTS

| 6,221,725 B1 * | 4/2001 | Lee ................................ 438/304 |
| 6,306,743 B1 * | 10/2001 | Lee ................................ 438/592 |
| 2003/0082862 A1 * | 5/2003 | Richter et al. ................. 438/197 |

FOREIGN PATENT DOCUMENTS

| KR | 1019990061719 | 7/2001 |
| KR | 1020010001171 | 7/2001 |

* cited by examiner

*Primary Examiner* — Howard Weiss
(74) *Attorney, Agent, or Firm* — Ladas & Parry LLP

(57) ABSTRACT

Disclosed are a semiconductor device with a metal gate and a method of manufacturing the same. The method of the present invention includes: preparing a semiconductor substrate having a isolation layer to define an active region; forming a gate insulation layer on the semiconductor substrate; sequentially forming a polysilicon layer, a first metal silicide layer, a metal nitride layer and a metal layer on the gate insulation layer including the isolation layer; etching the metal layer and the metal nitride layer so that the metal layer and the metal nitride layer have a narrower width than that of a desired gate; forming a second metal silicide layer on the first metal silicide layer including the etched metal nitride layer and the metal layer; forming a hard mask on the second metal silicide layer so that the hard mask has a desired gate width; and etching the second metal silicide layer, the first metal silicide layer, the polysilicon layer and the gate insulation layer by using the hard mask as an etching barrier, so as to form a metal gate with a structure in which the metal nitride and the metal layer are enclosed with the first and second metal silicide layers.

9 Claims, 7 Drawing Sheets

METHOD FOR FORMING GATE HAVING METAL LAYER IN SEMICONDUCTOR DEVICE

BACKGROUND OF THE INVENTION

1. Field of the Invention

The present invention relates to a method of manufacturing a semiconductor device, and more particularly to a semiconductor device which includes a metal gate having a low resistance and a method of manufacturing the same.

2. Description of the Prior Art

Recently, as a design rule for Metal Oxide Semiconductor Field-Effect Transistor (MOSFET) devices have been rapidly decreased to a level less than a sub-100 nm class, RC delay of a gate, i.e. a word-line, has become an important issue. Therefore, in order to solve the RC delay of the word-line, application of gate material with a lower resistivity has been attempted as an alternative plane. Specifically, a metal gate structure formed from stacked layers of a polysilicon layer and a metal layer is used as the gate material, instead of a polysilicide gate structure formed from stacked layers of a polysilicon layer and a metal silicide layer. Recently, for example, the application of tungsten gate in which tungsten is used as a metal layer has been actively researched.

Further, as a channel length becomes shorter due to the high integration of the MOSFET devices, the occurrence of defect in the MOSFET devices is increasing due to the short channel effect. A recess gate in which a recess is formed as a gate on a portion of a semiconductor substrate in manufacturing a transistor is being actively researched and developed. According to such a recess gate structure, the channel length can be increased by forming the gate in the recess, thereby remarkably decreasing the occurrence of defects due to the short channel effect, in comparison with the conventional planar gate structure.

Hereinafter, a method of manufacturing a semiconductor device having a tungsten gate, which is currently used, will be described in brief with reference to FIGS. 1A and 1B.

Referring to FIG. 1A, a isolation layer 2 defining an active region is formed on a semiconductor substrate 1. Next, after a gate insulation layer 3 is formed in the active region defined by the isolation layer 2 in a gate oxidation process, a polysilicon layer 4, a tungsten nitride layer 5 and a tungsten layer 6 are sequentially formed as a gate conductive layer on the gate insulation layer 3 including the isolation layer 2.

Referring to FIG. 1B, after a nitride layer is deposited on the tungsten layer 6, the nitride layer is patterned so as to form a gate hard mask 7 defining a gate region. Then, the tungsten layer 6, the tungsten nitride layer 5, the polysilicon layer 4 and the gate insulation layer 3 are sequentially etched by using the gate hard mask 7 as an etching barrier, so as to form a tungsten gate 8.

Although not shown, a gate re-oxidation step is performed for the resultant of the semiconductor device on which the tungsten gate 8 is formed, thereby recovering etching damages. Next, a series of known succeeding steps of forming a Lightly Doped Drain region (LDD region), forming a gate spacer, and forming a junction region are sequentially carried out so as to manufacture the semiconductor device with the tungsten gate.

However, the conventional method of manufacturing the semiconductor device with the tungsten gate as described above has problems as follows:

First, the gate re-oxidation process is conventionally performed in order to recover the etching damages, after etching the gate. At this time, in the case of performing the typical oxidation process, since abnormal oxidation may be caused at a side surface of the tungsten oxidation layer, a selective oxidation process in which the tungsten layer is not oxidized is carried out instead of the typical oxidation process. Although the selective oxidation process can prevent occurrence of the abnormal oxidation phenomenon at the side surface of the tungsten layer, it cannot prevent the occurrence of defects caused by permeation of oxygen through an interface between the tungsten layer and a polysilicon layer.

Further, in the case of the existing tungsten silicide gate, no deterioration of the characteristics of the gate caused by stress of the nitride layer for the hard mask after etching the gate has been found. However, in the case of the tungsten gate, a stress induced leakage current and an interface trap density caused by the stress of the nitride layer for the hard mask are increasing. These phenomena occur when the stress of the nitride layer for the hard mask is transferred to the tungsten layer, because the tungsten makes a direct effect on the gate insulation layer in the state that the stress applied to the tungsten is insufficiently relaxed due to its characteristic. As a result, voids are generated between the gate insulation layer and the polysilicon layer. To the end, the voids cause the deterioration of the characteristics of the gate.

Therefore, in order to develop the high speed device products, it is possible to realize the semiconductor device to which the tungsten gate is applied so that the aforementioned two problems must be solved.

SUMMARY OF THE INVENTION

Accordingly, the present invention has been developed in order to solve the above-mentioned problems occurring in the prior art, and an object of the present invention is to provide a semiconductor device and a method of manufacturing the same, which can prevent a tungsten layer from being abnormally oxidized in a gate re-oxidation process.

Another object of the present invention is to provide a semiconductor device and a method of manufacturing the same, which can prevent the deterioration of the characteristics of a tungsten gate caused by stress of a nitride layer for a hard mask.

Still another object of the present invention is to provide a semiconductor device and a method of manufacturing the same, which can prevent the deterioration of the characteristics of a tungsten layer due to the abnormal oxidation of the tungsten layer and a stress of a nitride layer for a hard mask.

According to an aspect of the present invention to accomplish these objects, there is provided a semiconductor device which comprises: a silicon substrate; a isolation layer formed on the silicon substrate for defining an active region; a metal gate which is formed in the active region defined by the isolation layer, and enclosed with a metal silicide layer; and a junction region formed at both sides of the metal gate in the active region on the semiconductor substrate.

Here, the metal gate is formed in such a manner that a gate insulation layer, a polysilicon layer, a first metal silicide layer, a metal nitride layer and a metal layer are sequentially stacked in a pattern, that a second metal silicide layer is formed on the upper surface of the metal layer and a side of the metal layer including the metal nitride layer, and that a hard mask is formed in a pattern on the second metal silicide layer.

The first and second metal silicide layers include a tungsten silicide layer, the metal nitride layer includes a tungsten nitride layer, the metal layer includes a tungsten layer, and the hard mask includes a nitride layer.

The metal nitride layer and the metal layer, which include the second metal silicide layer formed on the sides thereof, are formed with a width identical with or smaller than that of the first metal silicide layer.

In the semiconductor device of the present invention, the semiconductor substrate is recessed the active region in which the metal gate is formed, so as to form a recess gate structure.

In the semiconductor device of the present invention, further, the semiconductor substrate has a step-gated asymmetry recess structure in which both sides of the active region are recessed along a length of the active region so that a gate region is stepped.

In order to accomplish the objects of the present invention, according to another aspect of the present invention, there is provided a method of manufacturing a semiconductor device, which comprises the steps of: preparing a semiconductor substrate having a isolation layer to define an active region; forming a gate insulation layer on the semiconductor substrate; sequentially forming a polysilicon layer, a first metal silicide layer, a metal nitride layer and a metal layer on the gate insulation layer including the isolation layer; etching the metal layer and the metal nitride layer so that the metal layer and the metal nitride layer have a narrower width than that of a desired gate; forming a second metal silicide layer on the first metal silicide layer including the etched metal nitride layer and the metal layer; forming a hard mask on the second metal silicide layer so that the hard mask has a desired gate width; and etching the second metal silicide layer, the first metal silicide layer, the polysilicon layer and the gate insulation layer by using the hard mask as an etching barrier, so as to form a metal gate with a structure in which the metal nitride and the metal layer are enclosed with the first and second metal silicide layers.

In order to accomplish the objects of the present invention, there is provided a method of manufacturing a semiconductor device, which comprises the steps of: preparing a semiconductor substrate having a isolation layer to define an active region; etching a gate region in the active region on the semiconductor substrate, so as to form recesses; forming a gate insulation layer on the semiconductor substrate having the recesses; forming a polysilicon layer on the gate insulation layer so as to fill up the recesses; sequentially forming a first metal silicide layer, a metal nitride layer and a metal layer on the polysilicon layer; etching the metal layer and the metal nitride layer to have a narrower width than that of a desired gate; forming a second metal silicide layer on the first metal silicide layer including the etched metal nitride layer and the metal layer; forming a hard mask on the second metal silicide layer so that the hard mask has a desired gate width; and etching the second metal silicide layer, the first metal silicide layer, the polysilicone layer and the gate insulation layer by using the hard mask as an etching barrier so as to form a metal gate with a structure in which the etched metal nitride layer and the metal layer are enclosed with the first and second metal silicide layer.

In order to accomplish the objects of the present invention, there is a provided a method of manufacturing a semiconductor device, which comprises the steps of: preparing a semi-conductor substrate having a isolation layer to define an active region; recessing the both sides of the active region on the semiconductor substrate so that a gate region is stepped in a lengthwise direction of the active region; forming a gate insulation layer on the stepped semiconductor substrate; forming a polysilicon layer, a first metal silicide layer, a metal nitride layer and a metal layer on the gate insulation layer; etching the metal layer and the metal nitride layer having a narrower width than that of a desired gate; forming a second metal silicide layer on the first metal silicide layer including the etched metal nitride layer and the metal layer; forming a hard mask on the second metal silicide layer so that the hard mask has a desired gate width; and etching the second metal silicide layer, the first metal silicide layer, the polysilicon layer and the gate insulation layer by using the hard mask as an etching barrier, so as to form a metal gate, which has a structure in that the etched metal nitride layer and the metal layer are enclosed with the first and second metal silicide layers, in the active region on the stepped semiconductor substrate.

According to the present invention, the method of manufacturing a semiconductor device further comprises a step of forming a junction region at both sides of the metal gate on the semiconductor substrate, after the step of forming the metal gate.

According to the present invention, the first and second metal silicide layers are formed with tungsten silicide, the metal nitride is formed with tungsten nitride, the metal layer is formed with tungsten, and the hard mask is formed with nitride. Here, the first metal silicide layer has a thickness of 200~400 Å, the metal nitride layer has a thickness of 50~100 Å, the metal layer has a thickness of 300~400 Å, and the second metal silicide layer has a thickness of 200~400 Å.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENTS

Hereinafter, the preferred embodiment of the present invention will be described with reference to the accompanying drawings.

FIGS. 2A to 2D are sectional views illustrating a method of manufacturing a semiconductor device having a metal gate according to an embodiment of the present invention, in which the semiconductor device is shown step by step.

Figure 1A:
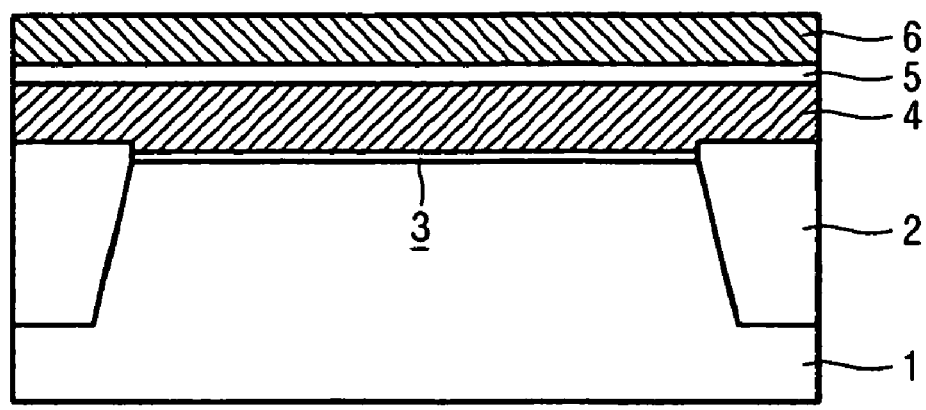
FIGS. 1A and 1B are sectional views illustrating a method of manufacturing a conventional semiconductor device having a tungsten gate, in which the semiconductor device is shown in sections step by step.
Figure 1B:
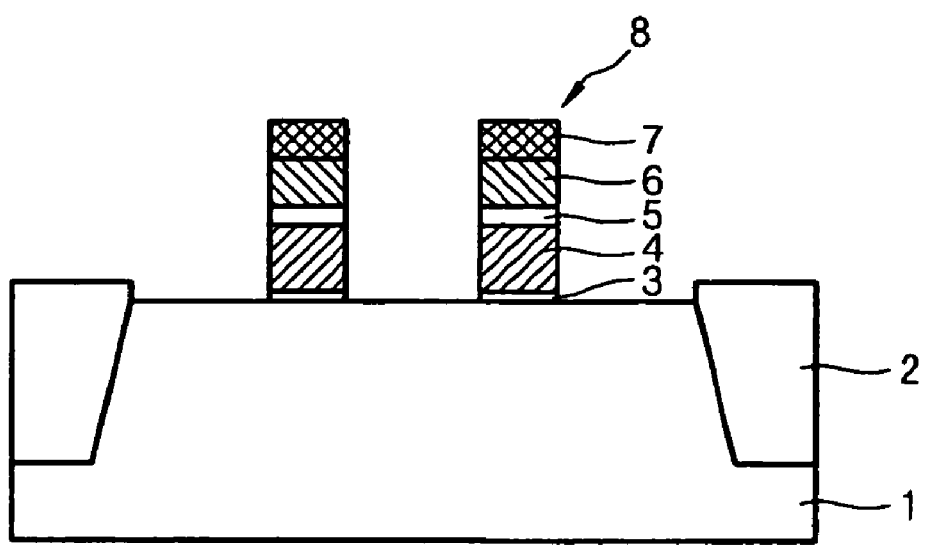
Figure 2A:
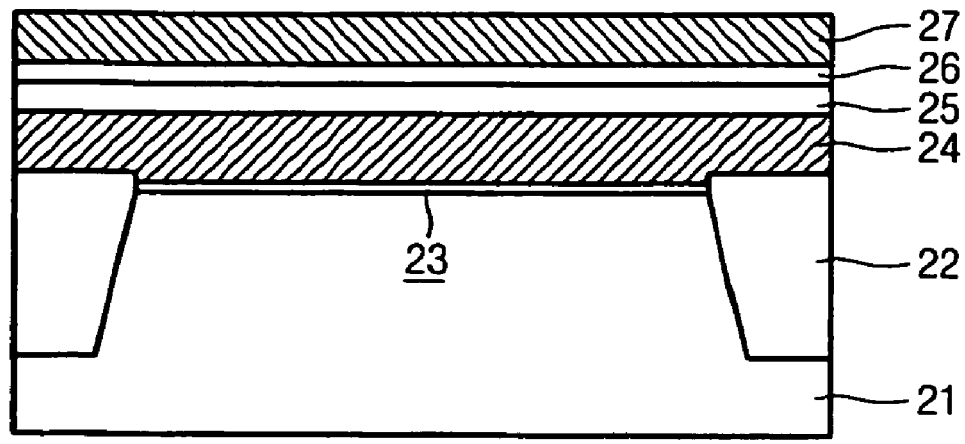
FIGS. 2A to 2D are sectional views illustrating a method of manufacturing a semiconductor device having a metal gate according to an embodiment of the present invention, in which the semiconductor device is shown step by step.

Referring to FIG. 2A, a semiconductor substrate 21 is prepared, which includes a isolation layer 22 defining an active region. Next, well ion injection and channel ion injection are sequentially performed. Then, after a gate insulation layer 23, i.e. oxidation layer, is formed on the active region of the substrate 21 in such a gate oxidization process, a doped poly-silicon layer 24 is formed on the gate oxidation layer 23 including the isolation layer 22.

Next, a first metal silicide layer, preferably a first tungsten silicide layer 25, is formed on the poly-silicon layer 24. Then, after a metal nitride layer, preferably a tungsten nitride layer 26, is deposited, a metal layer, preferably a tungsten layer 27, is deposited on the tungsten nitride layer 26. Here, the first tungsten silicide layer 25 has a thickness of 200~400 Å, and the tungsten nitride layer 26 is formed with a thickness of 50~100 Å, and the tungsten layer 27 has a thickness of 300~400 Å.

Figure 2B:
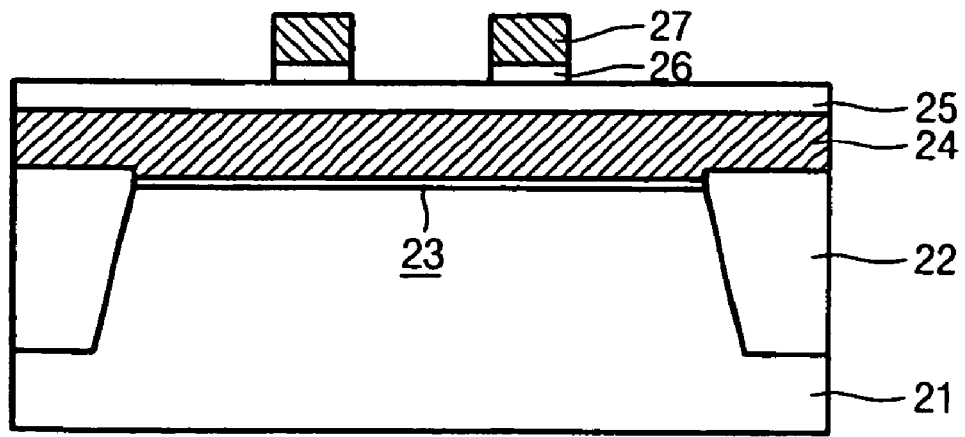

Referring to FIG. 2B, the tungsten layer 27 and the tungsten nitride layer 26 are etched using a known process. At this time, the etching of the tungsten layer 27 and the tungsten nitride layer 26 is performed in such a manner that a CD bias is increased to the maximum, so that the etched tungsten layer 27 and the tungsten nitride layer 26 have a narrower width than that of a desired gate.

Figure 2C:
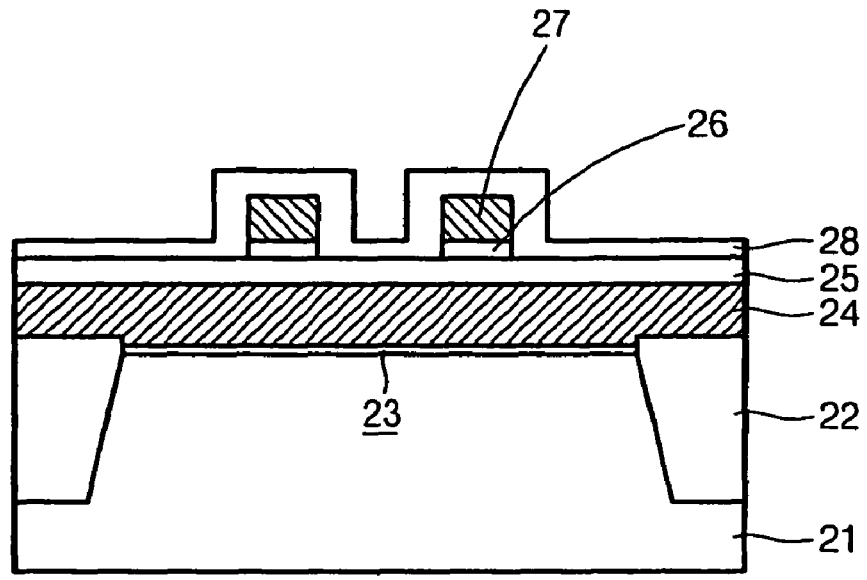

Referring to FIG. 2C, a second metal silicide layer, preferably a second tungsten silicide layer 28, is formed on the first tungsten silicide layer 25 including the etched tungsten nitride layer 26 and the tungsten layer 27. At this time, the second tungsten silicide layer 28 has a thickness of 200~400 Å.

Figure 2D:
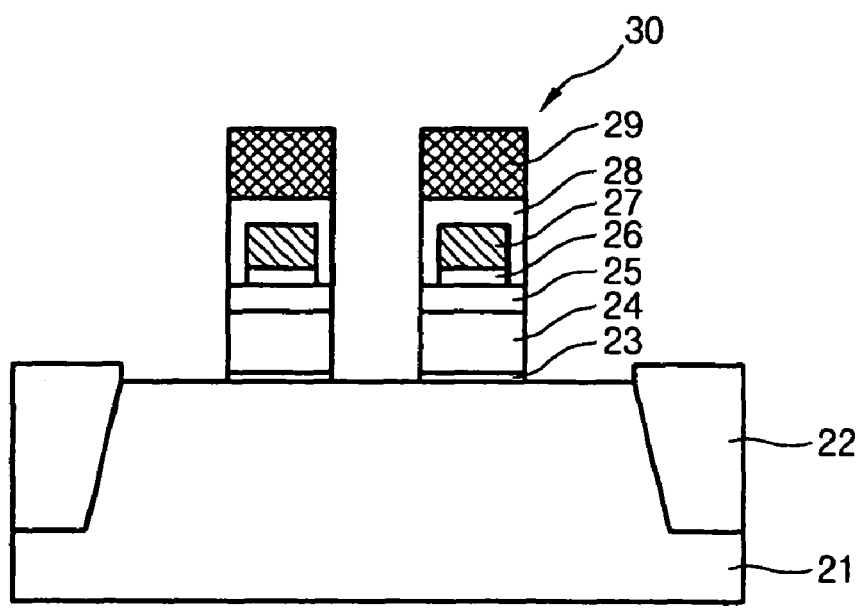

Referring to FIG. 2D, after a nitride layer for a hard mask is formed on the second tungsten silicide layer 28, the nitride layer is patterned using a known process so as to form the hard mask 29 having a desired gate width. Next, the tungsten silicide layer 28, the first tungsten silicide layer 25, the poly-silicon layer 24 and the gate insulation layer 23, which are located below the hard mask 29, are sequentially etched by using the hard mask 29 as an etching barrier, thereby forming a metal gate, i.e. a tungsten gate 30, in which the tungsten nitride layer 26 and the tungsten layer 27 are enclosed with the first and second tungsten silicide layers 25 and 28.

Then, a gate re-oxidation process is performed for the resultant semiconductor substrate having the tungsten gate 30 formed thereon, in order to recover an etching damage caused by the etching of the gate.

According to the present invention, here, since the tungsten gate 30 is formed with a core type structure in that the tungsten layer 27 including the tungsten nitride layer 26 is enclosed with the first and second tungsten silicide layers 25 and 28, the abnormal oxidization phenomenon is prevented from occurring at the side of the tungsten layer 27. In addition, oxygen is completely prevented from penetrating the interface between the tungsten layer 27 and the poly-silicon layer 24, thereby removing the instability of the interface.

In the tungsten gate structure according to the present invention, moreover, since the second tungsten silicide layer 28 deposited on the surface of the tungsten layer 27 plays the role of a buffer layer during the forming of the nitride layer used for the hard mask, the stress can be relieved, or prevented from being transmitted to the tungsten layer 27 during the forming of the nitride layer for the hard mask. Thus, it is possible to effectively restrain the deterioration of the characteristics of the gate which may be caused by the stress of the nitride layer for the hard mask.

Then, although not shown, a series of known following processes including a LDD region forming process, a gate spacer forming process, and a junction region forming process are sequentially carried out to accomplish the manufacturing of the semiconductor device having the metal gate according to the present invention.

In the above-mentioned embodiment of the present invention, on the other hand, although the method of manufacturing the semiconductor device having the metal gate with a plan gate structure has been described, the present invention may be applied for forming a metal gate with a recess gate structure.

Specifically, FIGS. 3A to 3E are sectional views illustrating a method of manufacturing a semiconductor device having a metal gate according to another embodiment of the present invention, in which the semiconductor device is shown step by step. The same reference numerals are used to indicate the same elements as those of FIGS. 2A to 2D. Hereinafter, the method of manufacturing the semiconductor device according to another embodiment of the present invention will be described.

Figure 3A:
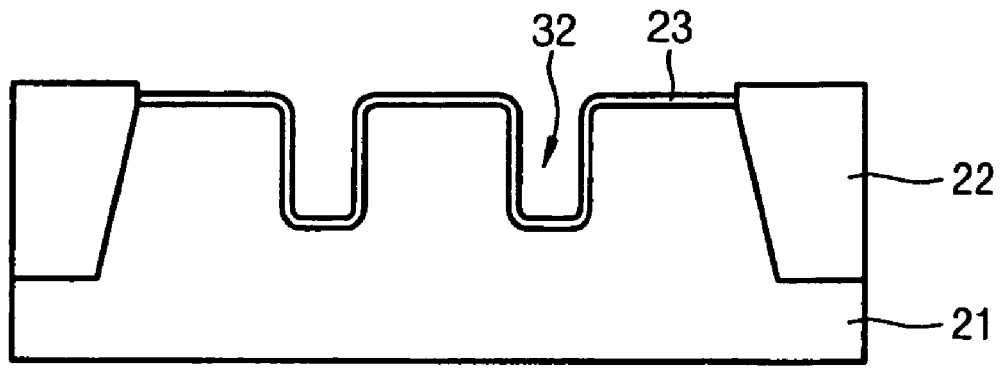
FIGS. 3A to 3E are sectional views illustrating a method of manufacturing a semiconductor device having a metal gate according to another embodiment of the present invention, in which the semiconductor device is shown step by step.

Referring to FIG. 3A, a semiconductor substrate 21 is prepared, which has a isolation layer 22 defining an active region. Next, after an oxidation layer and a polysilicon layer are sequentially formed on the semiconductor substrate including the isolation layer 22 although not shown, the polysilicon layer and the oxidation layer are etched to expose the gate region in the active region of the semiconductor substrate.

Next, after the exposed gate region in the active region of the semiconductor substrate is etched so that a recess 32 is formed, the polysilicon layer and the oxidation layer used as an etching barrier are removed. Then, well ion injection and channel ion injection are sequentially carried out, so that a gate insulation layer 23 is formed in the active region on the surface of the semiconductor substrate.

Figure 3B:
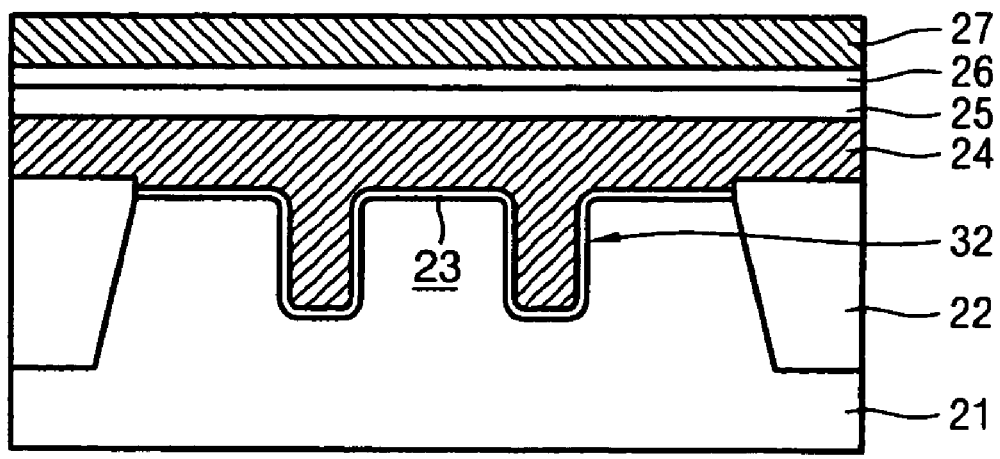

Referring to FIG. 3B, a polysilicon layer 24 is formed on the semiconductor substrate including the gate insulation layer 23 so as to fill up the recess 32, and then a first tungsten silicide layer 25, which is a first metal silicide layer, is formed on the polysilicon layer 24. Next, a tungsten nitride layer 26 is formed as a metal nitride layer on the first tungsten silicide layer 25. Finally, a tungsten layer 27 is formed as a metal layer on the tungsten nitride layer 26. Here, the first tungsten silicide layer 25 has a thickness of 200~400 Å, the tungsten nitride layer 26 has a thickness of 50~100 Å, and the tungsten layer 27 has a thickness of 300~400 Å.

Figure 3C:
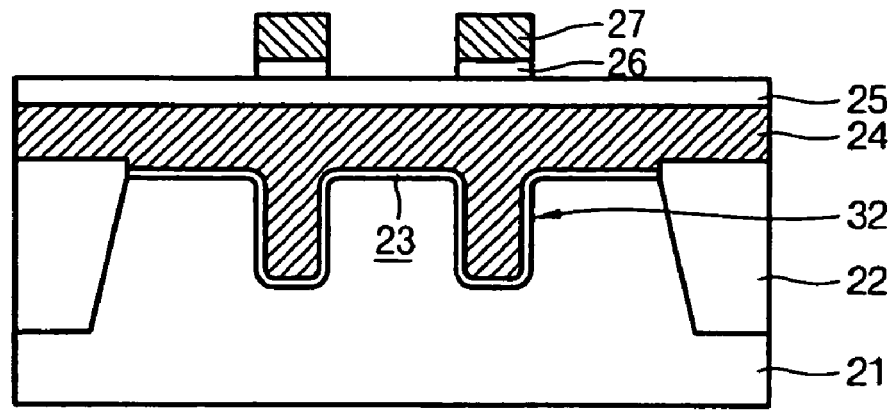

Referring to FIG. 3C, the tungsten layer 27 and the tungsten nitride layer 26 are etched according to a known process. At this time, the etching of the tungsten layer 27 and the tungsten nitride layer 26 is carried out in the same manner as that of the aforementioned embodiment of the present invention, so that the etched tungsten layer 27 and the tungsten nitride layer 26 have a narrower width than that of a desired gate.

Figure 3D:
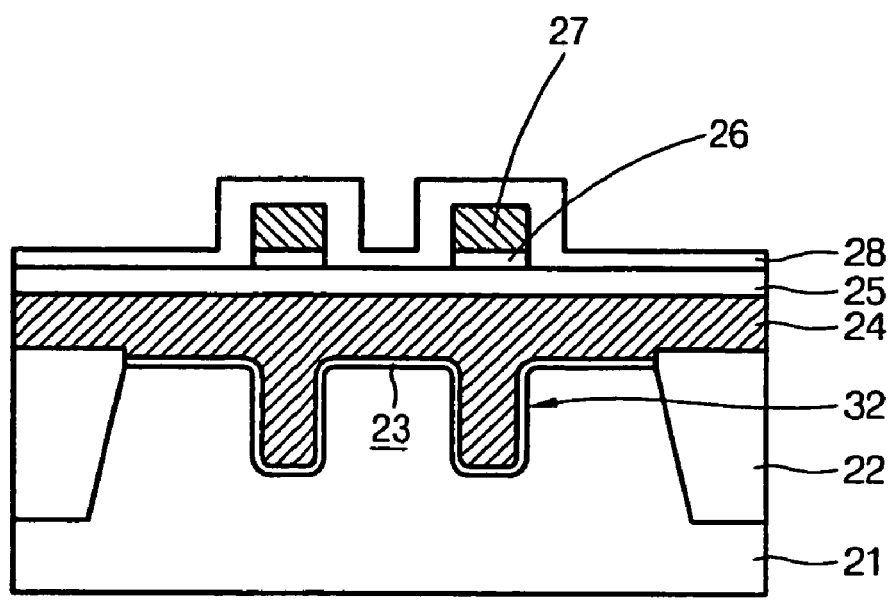

Referring to FIG. 3D, a second tungsten silicide layer 28 is formed as a second silicide layer on the first tungsten silicide layer 25 including the etched tungsten nitride layer 26 and the tungsten layer 27, so as to have a thickness of 200~400 Å.

Figure 3E:
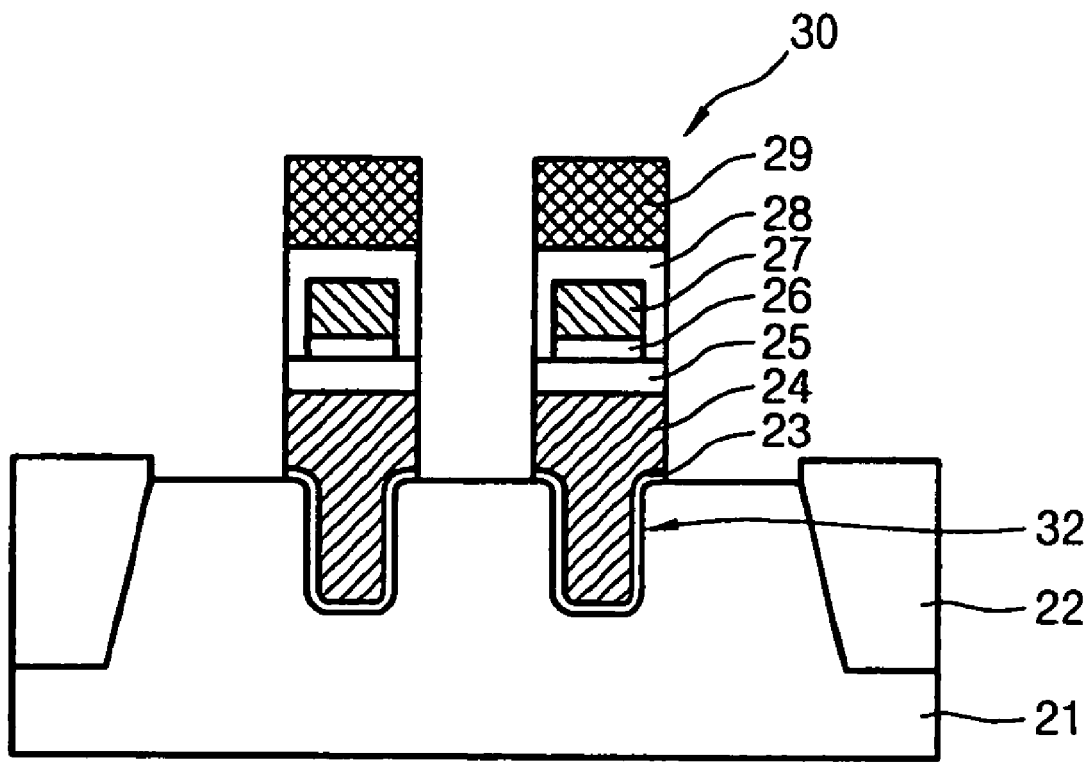

Referring to FIG. 3E, a hard mask 29 is formed on the second tungsten silicide layer 28 according to the known process, which includes a nitride layer defining a gate region and having a desired width corresponding to that of a gate. Then, the second silicide layer 28, the first silicide layer 25, the doped polysilicon layer 24 and the gate insulation layer 23 are sequentially etched by using the hard mask 29 as an etching barrier. As a result, a metal gate, i.e. a tungsten gate 30 is formed with a structure in which the tungsten layer 27 including the tungsten nitride layer 26 is enclosed with the first and second tungsten silicide layers 25 and 28.

Then, a gate re-oxidation process is carried out for the resultant semiconductor substrate on which the tungsten gate 21 is formed, in order to recover an etched damage. Next, a series of known succeeding processes of forming a LDD region, forming a gate spacer and forming a junction region are sequentially performed to accomplish the method of manufacturing the semiconductor device having the metal gate according to the present invention.

Since the semiconductor device according to another embodiment of the present invention has a core type structure in which the tungsten nitride layer 26 and the tungsten layer 27 are enclosed with the first and second tungsten silicide layers 25 and 28, it is possible to prevent the abnormal phenomenon at the side of the tungsten layer 27 as well as to remove the instability of the interface, during the gate re-oxidation process. In addition, as the second tungsten silicide layer 28 deposited on the tungsten layer 27 plays the role of a buffer layer during the forming of the nitride layer for the hard mask, it is also possible to prevent the deterioration of the characteristics of the gate caused by the stress of the nitride layer for the hard mask.

Figure 4A:
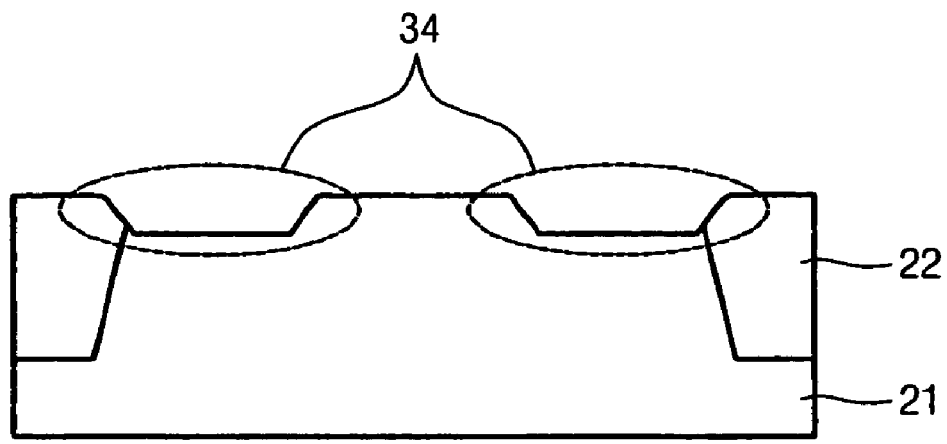
FIGS. 4A to 4B are sectional views illustrating a method of manufacturing a semiconductor device having a metal gate according to still another embodiment of the present invention, in which the semiconductor device is shown step by step.
Figure 4B:
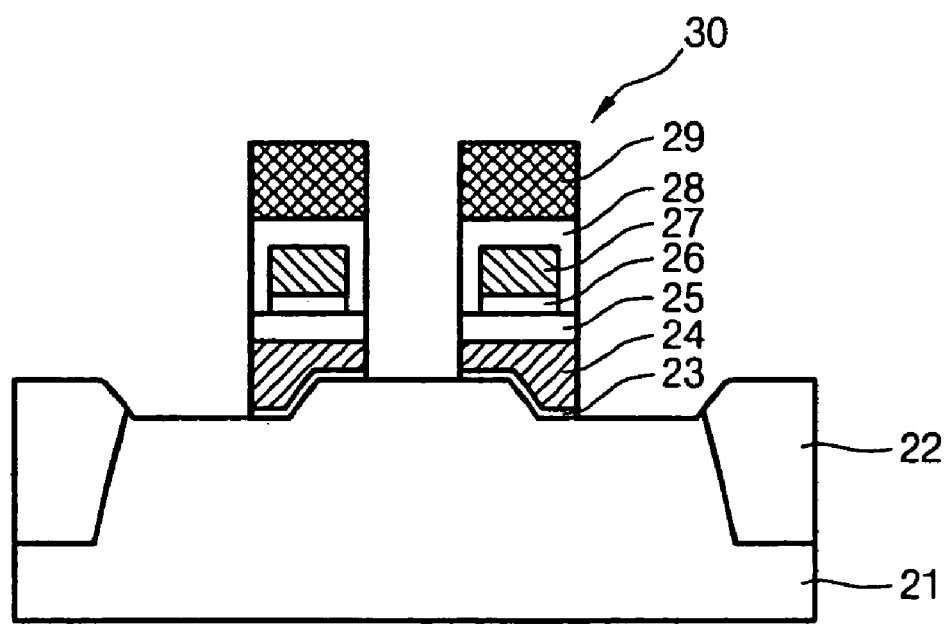

FIGS. 4A to 4B are sectional views illustrating a method of manufacturing a semiconductor device having a metal gate according to still another embodiment of the present invention, in which the semiconductor device is shown step by step. The same reference numerals are used to indicate the same elements as those in FIGS. 2A to 2D. Hereinafter, the method of manufacturing the semiconductor device according to this embodiment of the present invention will be described.

The present embodiment relates to a method of manufacturing a semiconductor device having a metal gate with a step-gated asymmetry recess structure. As shown in FIG. 4A, first, a semiconductor substrate 21 is prepared, which has a isolation layer 22 defining an active region. Then, the semiconductor substrate has recesses 34 formed by a desired depth at both sides of an active region thereof along the length of the active region, so that a gate region is stepped. At this time, although not shown or described, a stacked layer of an oxidation layer and a polysilicon layer, or a stacked layer of an oxidation layer and a nitride layer can be used as a mask for the recesses.

Next, a series of succeeding processes identical with those of the aforementioned embodiment of the present invention are performed for the resultant semiconductor substrate having the recesses 34 formed at both sides of the active region thereof along the length of the active region, although not specifically shown or described. As shown in FIG. 4B, a tungsten gate 30 is formed in the stepped active region on the semiconductor substrate, which has a core type structure in which the tungsten nitride layer 26 and the tungsten layer 27 are enclosed with the first and second tungsten silicide layers 25 and 28.

Finally, a series of known succeeding processes including a gate re-oxidation process, a LDD region forming process, a gate spacer forming process and a junction region forming process are sequentially carried out, so as to accomplish the manufacturing of the semiconductor device having the metal gate.

Since the semiconductor device according to another embodiment of the present invention has the tungsten gate 30 formed with a core type structure in which the tungsten layer 27 is enclosed with the first and second tungsten silicide layers 25 and 28, it is possible to prevent the abnormal oxidation phenomenon from occurring at the side of the tungsten layer 27 during the gate oxidation process. In addition, it is possible to remove the instability of the interface between the tungsten layer 27 and the tungsten silicide layers 25 and 28. Moreover, the second tungsten silicide layer 28 playing the role of buffering stress is deposited on the tungsten layer 27, thereby effectively preventing the deterioration of the characteristics of the gate caused by the stress of the nitride layer for the hard mask.

As described above, the present invention has the metal gate formed with the core type structure in which the metal layer is completely enclosed with the metal silicide layer, thereby preventing the abnormal oxidation of the tungsten and relieving the instability of the interface during a succeeding gate re-oxidation process.

According to the present invention, furthermore, the metal silicide layer is disposed between the metal layer and the nitride layer for the hard mask as a buffer layer for buffering stress, thereby preventing the deterioration of the characteristics of the metal gate resulting from the stress from the nitride layer of the hard mask and improving the characteristics of the device.

According to the present invention, in addition, since a metal layer which has greatly lower resistivity than the existing metal silicide layer, is applied to the semiconductor device to form the gate, it is possible to realize a high speed device, and to advantageously apply the metal layer for the manufacturing of large integrated device of 50 nm class.

While a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, comprising the steps of:
   preparing a semiconductor substrate having a isolation layer to define an active region;
   forming a gate insulation layer on the semiconductor substrate;
   sequentially forming a polysilicon layer, a first metal silicide layer, a metal nitride layer and a metal layer on the gate insulation layer including the isolation layer;
   etching the metal layer and the metal nitride layer so that the metal layer and the metal nitride layer have a narrower width than that of a desired gate;
   forming a second metal silicide layer on the first metal silicide layer including the etched metal nitride layer and the metal layer;
   forming a hard mask on the second metal silicide layer so that the hard mask has a desired gate width; and
   etching the second metal silicide layer, the first metal silicide layer, the polysilicon layer and the gate insulation layer by using the hard mask as an etching barrier, so as to form a metal gate with a structure in which the metal nitride and the metal layer are enclosed with the first and second metal silicide layers.

2. The method of manufacturing a semiconductor device as claimed in claim 1, further comprising a step of forming a junction region at both sides of the metal gate on the semiconductor substrate, after the step of forming the metal gate.

3. The method of manufacturing a semiconductor device as claimed in claim 1, wherein the first and second metal silicide layers are formed with tungsten silicide, the metal nitride is formed with tungsten nitride, the metal layer is formed with tungsten, and the hard mask is formed with nitride.

4. The method of manufacturing a semiconductor device as claimed in claim 1, wherein the first metal silicide layer has a thickness of 200~400 Å.

5. The method of manufacturing a semiconductor device as claimed in claim 1, wherein the metal nitride layer has a thickness of 50~100 Å.

6. The method of manufacturing a semiconductor device as claimed in claim 1, wherein the metal layer has a thickness of 300~400 Å.

7. The method of manufacturing a semiconductor device as claimed in claim 1, wherein the second metal silicide layer has a thickness of 200~400 Å.

8. The method of manufacturing a semiconductor device as claimed in claim 1, further comprising a step of etching a gate region in the active region on the semiconductor substrate so as to form recesses, after the step of preparing a semiconductor substrate and before forming a polysilicon layer.

9. The method of manufacturing a semiconductor device as claimed in claim 1, further comprising a step of recessing the both sides of the active region on the semiconductor substrate so that a gate region is stepped in a lengthwise direction of the active region, after the step of preparing a semiconductor substrate and before forming a polysilicon layer.

* * * * *